(12) United States Patent
Hunt et al.

(10) Patent No.: US 8,094,017 B2
(45) Date of Patent: Jan. 10, 2012

(54) ELECTROMAGNETIC LOCK MONITORING SYSTEM

(75) Inventors: Robert C. Hunt, Reno, NV (US); Jonathan King, Washoe Valley, NV (US)

(73) Assignee: Securitron Magnalock Corporation, Phoenix, AZ (US)

(*) Notice: Subject to any disclaimer, the term of this patent is extended or adjusted under 35 U.S.C. 154(b) by 407 days.

(21) Appl. No.: 12/345,727

(22) Filed: Dec. 30, 2008

(65) Prior Publication Data
US 2009/0173119 A1     Jul. 9, 2009

Related U.S. Application Data

(60) Provisional application No. 61/010,557, filed on Jan. 8, 2008.

(51) Int. Cl.
*E05B 45/06* (2006.01)

(52) U.S. Cl. ........... 340/542; 340/547; 340/545.3; 340/552; 324/251; 324/244; 324/260

(58) Field of Classification Search ........... 70/277; 324/251, 244, 260, 261, 243; 340/542, 547, 340/545.3, 552
See application file for complete search history.

(56) References Cited

U.S. PATENT DOCUMENTS

| | | | |
|---|---|---|---|
| 4,763,937 A * | 8/1988 | Sittnick et al. | 292/251.5 |
| 5,261,713 A | 11/1993 | Fischbach | |
| 5,641,187 A | 6/1997 | Frolov | |
| 6,271,751 B1 | 8/2001 | Hunt et al. | |
| 7,489,128 B2 * | 2/2009 | Kopp | 324/227 |
| 2005/0162802 A1 * | 7/2005 | Kho et al. | 361/139 |

FOREIGN PATENT DOCUMENTS

| | | |
|---|---|---|
| DE | 102006045073 | 4/2008 |
| EP | 0821123 | 1/1998 |
| GB | 2263137 | 7/1993 |
| WO | 2008034617 | 3/2008 |

OTHER PUBLICATIONS

European Patent Office, "European Search Report," dated May 17, 2010 for EP application No. 09010307.8, filed Aug. 10, 2009.

\* cited by examiner

*Primary Examiner* — Hoi Lau
(74) *Attorney, Agent, or Firm* — Woods Oviatt Gilman LLP

(57) ABSTRACT

An electromagnetic lock monitoring system for monitoring the strength of a magnetic field in an electromechanical lock which is created when a steel armature plate is closed against an electromagnet. The system utilizes dual Hall Effect devices positioned in such a way that both ends of the electromagnet and both magnetic fields are monitored, and that the resulting monitoring effectively covers the complete contact surface between the electromagnet and the armature plate. Preferably, the Hall Effect devices are disposed in series at the point of maximum flux density within the center element of an E-shaped electromagnetic core, at opposite ends of the core. If the magnetic flux is below a preset limit, a relay also in series drops out, triggering an alarm which may be sonic, electronic, and/or visual, as is known in the prior art.

9 Claims, 5 Drawing Sheets

ELECTROMAGNETIC LOCK MONITORING SYSTEM

RELATIONSHIP TO OTHER APPLICATIONS AND PATENTS

The present application claims priority from U.S. Provisional Patent Application, Ser. No. 61/010,557, filed Jan. 8, 2008.

TECHNICAL FIELD

The present invention relates to electromagnetic locks; more particularly, to apparatus for monitoring the lock status of electromagnetic locks; and most particularly, to an improved electromagnetic lock monitoring system employing a plurality of Hall Effect sensors.

BACKGROUND OF THE INVENTION

Electromagnetic locks for securing doors or gates are well known in the prior art. In a typical installation, a magnetically-susceptible plate is mounted on a door, and an electromagnet is mounted on a door jamb or gate post. When the electromagnet is energized, is in contact with the plate, and the door is closed, the plate becomes an armature for the electromagnet. Magnetic flux passes between the electromagnet and the armature, attracting the armature to the electromagnet and thus providing a mechanism for locking the door to the jamb. When the magnetic loop is complete, by contact of the armature with the electromagnet, the magnetic flux density is at a maximum. If the armature is separated from the electromagnet, the magnetic flux is decreased as a function of the distance therebetween. Thus, a device that can sense the strength of the magnetic field can be configured as an alarm mechanism for a door that is not fully or properly secured by an electromagnetic lock or for a door that is being forced open by an attempt to forcibly separate the armature and electromagnet.

It is well known in the prior art to employ a lock security alarm system based upon the Hall Effect, wherein the voltage potential orthogonal to a magnetic field is proportional to the strength of the magnetic field. Prior art devices typically employ a single Hall Effect device.

A significant problem with such a prior art system is that only the magnetic field immediately adjacent the Hall Effect device is actually monitored. Thus, an armature plate may be offset laterally by up to several inches from the electromagnet, thus significantly reducing the total holding force of the lock but still having the same magnetic strength near the Hall Effect device. Furthermore, use of a single Hall Effect device may lead to monitoring only half of the actual magnetic field available, as there are two overlapping magnetic fields in operation with a typical E-shaped magnetic core used in many prior art electromagnetic locks.

What is needed in the art is an improved Hall Effect lock security system that assures correct three-dimensional alignment and contact of an electromagnet lock and armature.

It is a principal object of the present invention to improve the reliability of electromagnetic locking of a door to a jamb.

SUMMARY OF THE INVENTION

Briefly described, an electromagnetic lock monitoring system in accordance with the present invention monitors the strength of a magnetic field in an electromechanical lock which is created when a steel armature plate is properly closed against the magnet. The system utilizes a plurality of Hall Effect devices, preferably two, positioned in such a way that both ends of the electromagnet and both magnetic fields are monitored, and that the resulting monitoring effectively covers the complete contact surface between the electromagnet and the armature plate.

Preferably, the Hall Effect devices are connected in series with a relay and are disposed at the point of maximum flux density within the center element of an E-shaped electromagnetic core, at opposite ends of the core. If the magnetic flux falls below a preset limit, the relay drops out, triggering an alarm which may be sonic, electronic, and/or visual, as is known in the prior art. Lock misalignments as small as 0.25 inch may be detected.

BRIEF DESCRIPTION OF THE DRAWINGS

The present invention will now be described, by way of example, with reference to the accompanying drawings, in which.

Corresponding reference characters indicate corresponding parts throughout the several views. The exemplifications set out herein illustrate currently preferred embodiments of the invention, and such exemplifications are not to be construed as limiting the scope of the invention in any manner.

DESCRIPTION OF THE PREFERRED EMBODIMENTS

Figure 1:
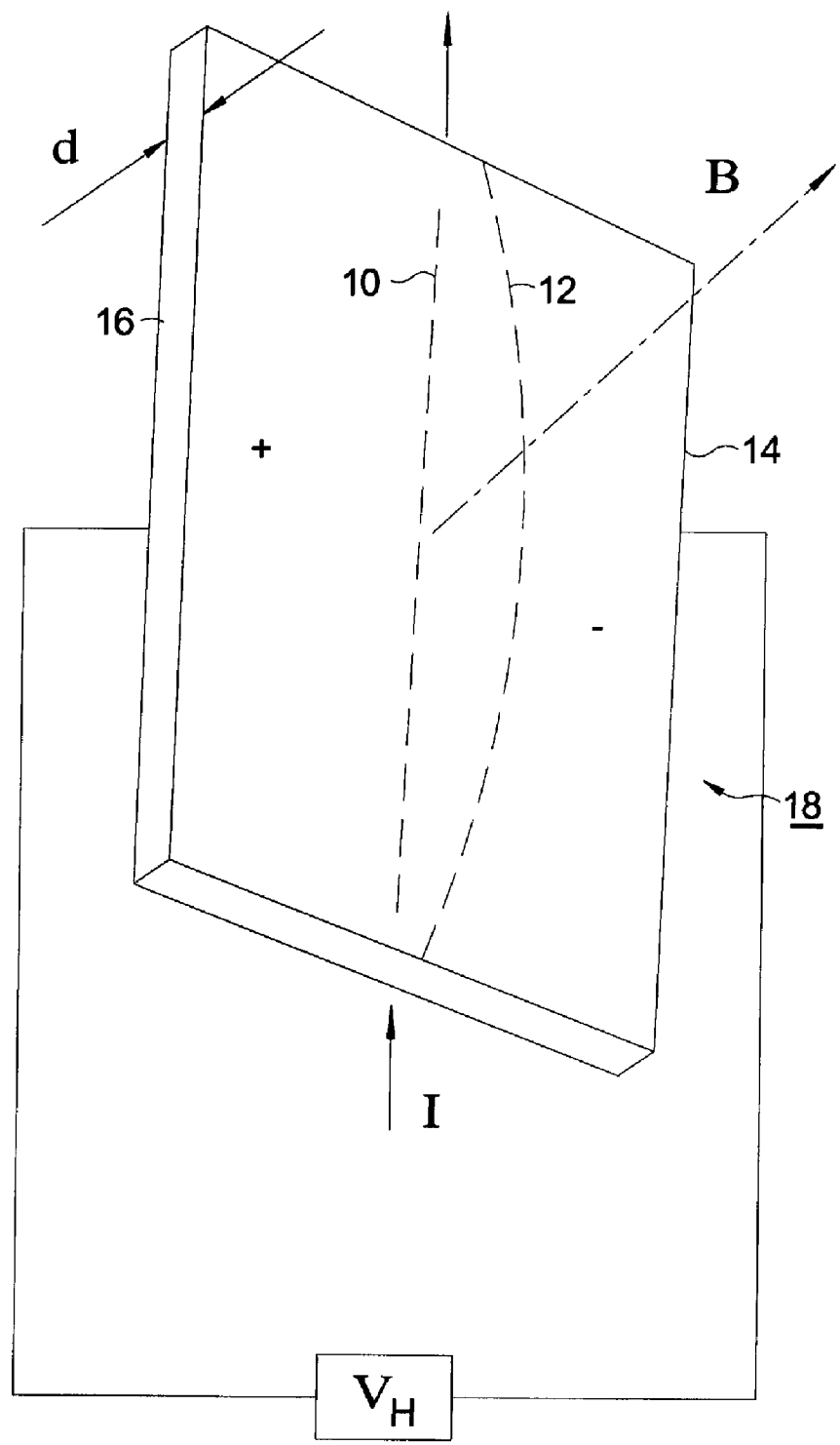
FIG. 1 is a schematic isometric drawing showing how the Hall Effect is generated.

Referring to FIG. 1, the Hall effect comes about due to the nature of the current in a conductor. Current I consists of the movement of many small charge-carrying "particles" (typically, but not necessarily, electrons). Moving charges experience a force, called the Lorentz Force, when a magnetic field B is present that is not parallel to their motion. When such a magnetic field is absent, the charges follow an approximately straight 'line of sight' path 10. However, when a perpendicular magnetic field B is applied, their path is curved 12 so that moving charges accumulate on one face 14 of the material. This leaves equal and opposite charges exposed on the other face 16, where there is a scarcity of mobile charges. The result is an asymmetric distribution of charge density across the Hall element 18 that is perpendicular to both the 'line of sight' path 10 and the applied magnetic field B. The separation of charge defines an electric field that opposes the migration of further charge, so a steady electrical potential builds up for as long as the charge is flowing. For a simple metal where there is only one type of charge carrier (electrons), the Hall voltage $V_H$ is given by $$V_H = \frac{-IB/d}{ne},$$

where I is the current across the plate length, B is the magnetic flux density, d is the depth of the plate, e is the electron charge, and n is the charge carrier density of the carrier electrons.

The Hall coefficient is defined as $$R_H = \frac{E_y}{j_x B} = \frac{V_H}{IB/d} = -\frac{1}{ne},$$

where j is the current density of the carrier electrons.

As a result, the Hall effect is very useful as a means to measure either the carrier density or the magnetic field. This sensitivity to the intensity of the magnetic field is applied in the present invention to monitor whether a magnetic strike plate is properly aligned to an electromagnetic lock in the X, Y, and Z directions.

Figure 2:
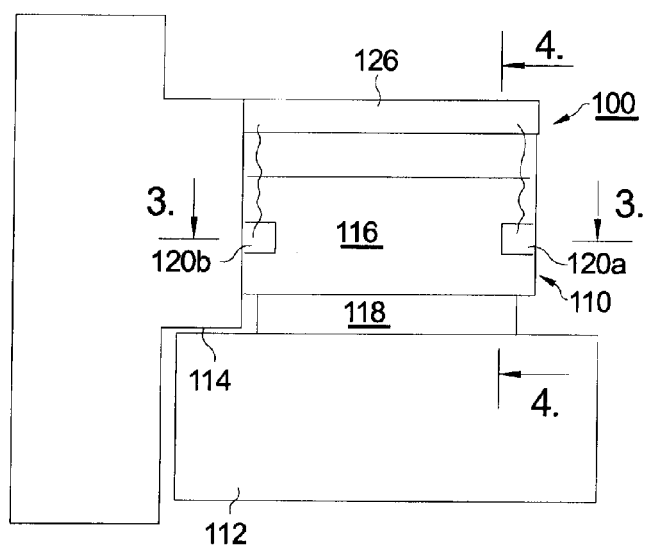
FIG. 2 is a plan view of a door closing into a jamb, the door being locked by an electromagnetic lock, and the lock being monitored by an electromagnetic monitoring system in accordance with the present invention.
Figure 3:
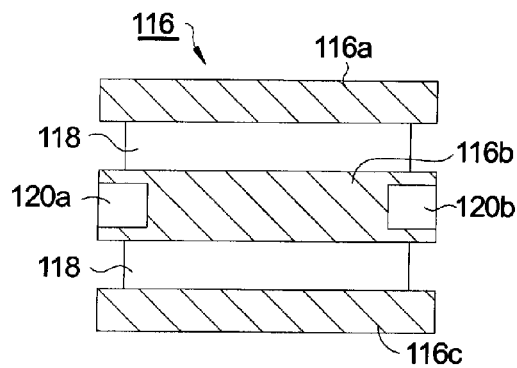
FIG. 3 is a cross-sectional view taken along line 3-3 in FIG. 2.
Figure 4:
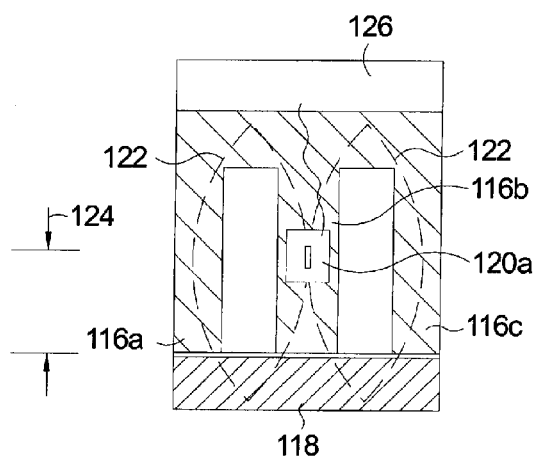
FIG. 4 is a cross-sectional view taken along line 4-4 in FIG. 2.

Referring now to FIGS. 2 through 4, the present invention is directed to a monitoring system 100 for an electromagnetic lock system 110 for securing gates, doors, or other closures 112 (referred to herein collectively as "doors") against a stationary jamb 114. Lock 110 comprises an electromagnet 116, which preferably is mounted on door jamb 114, and an armature strike plate 118, which preferably is mounted on door 112. This arrangement is preferable because it is easier to provide electric power to an electromagnet mounted on a stationary jamb, but of course the invention is equally functional when the electromagnet is mounted on the door (not shown) and the armature strike plate is mounted on the jamb (not shown).

To ensure that the maximum holding force between the two components 116,118 is provided, proper alignment between electromagnet 116 and armature plate 118 must be attained and maintained in all three mutually orthogonal directions, as described in detail below. As noted above, a single Hall Effect sensor as employed in the prior art may not reliably indicate an unacceptable condition of non-alignment. Therefore, in accordance with the present invention a plurality of Hall Effect devices are spaced apart within the magnetic field such that an alarm condition is established when any one of the Hall effect devices detects a magnetic field strength below a predetermined alarm level.

The Hall Effect sensors, preferably two, 120a, 120b, preferably are disposed as shown near the ends of electromagnet 116 and centered in the middle element 116a of the "E-shaped" magnetic core. At that point, the magnetic flux 122 is most concentrated and therefore provides the sharpest indication of flux reduction if the armature plate should be misaligned on the surface of the core. Dimension 124 is chosen to place the Hall Effect devices 120a, 120b at the point of maximum flux concentration for the core.

Hall Effect devices 120a, 120b are connected to a control apparatus 126 wherein devices 120a, 120b are connected in series with a relay as described below, defining lock monitoring system 100. Activation of the relay can occur if and only if the magnetic field near each of the Hall Effect devices is of sufficient strength to complete a circuit associated with each device. If the circuit is not closed when door 112 is in locked position, an error signal is generated.

Figure 5:
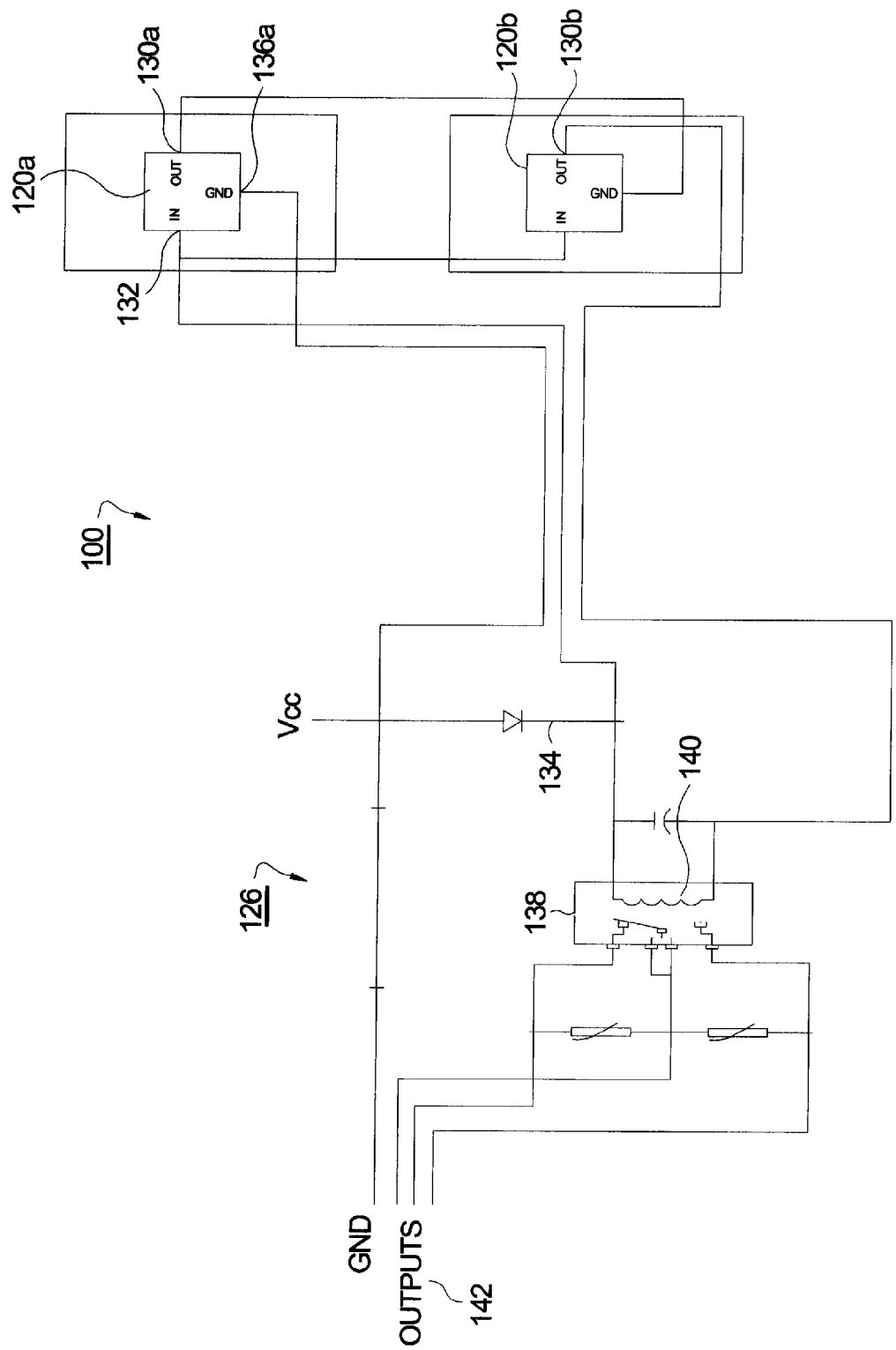
FIG. 5 is a schematic electrical drawing of a Hall Effect electromagnetic lock monitoring system in accordance with the present invention.
Figure 6:
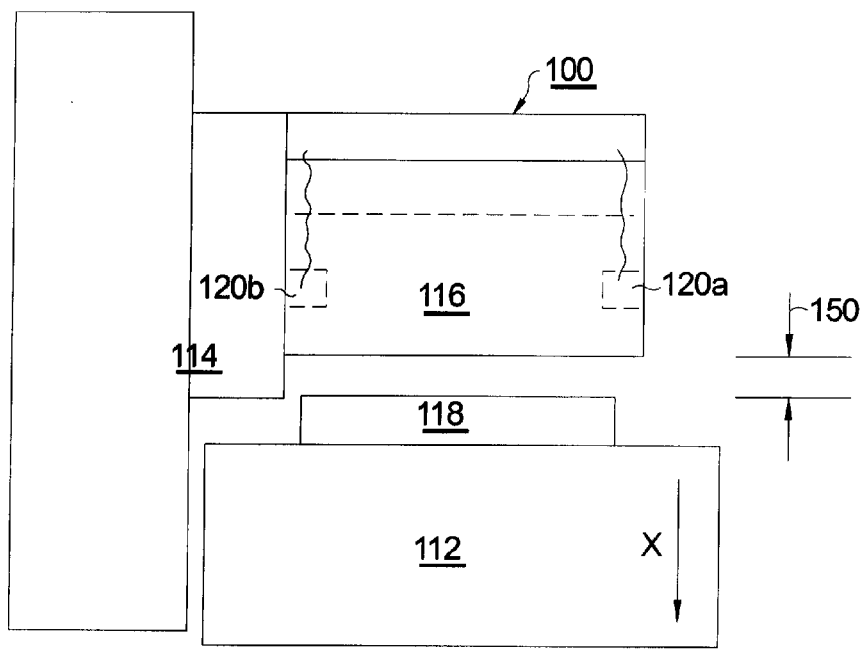
FIGS. 6 and 9 are respective views like those shown in FIGS. 2 and 4, showing an alarm condition for lock displacement in the X direction.
Figure 7:
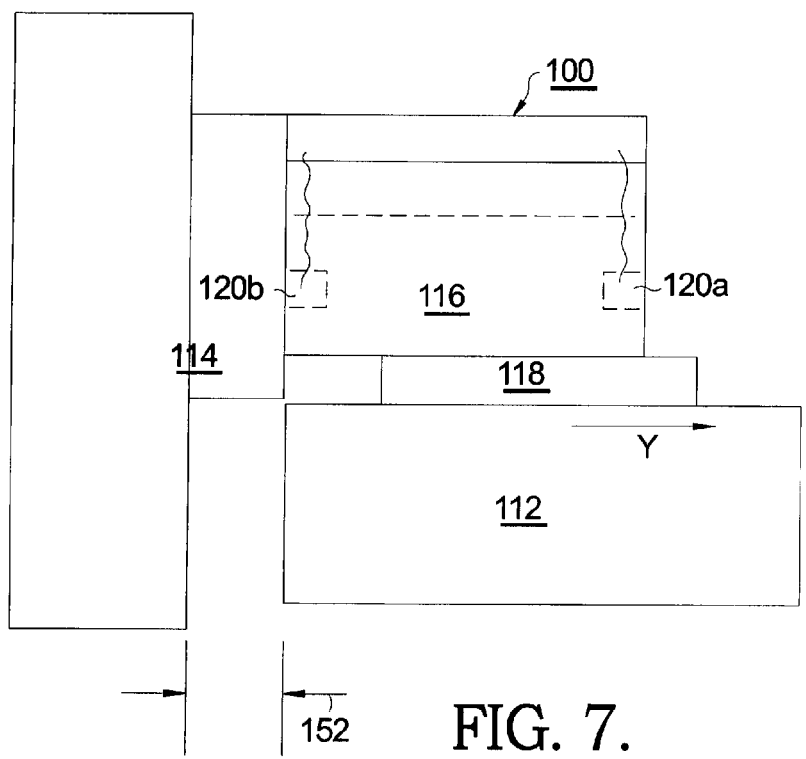
FIG. 7 is a view like that shown in FIG. 2, showing an alarm condition for lock displacement in the Y direction.

Referring to FIG. 5, Hall Effect devices, for example Allegro part number A3240, available from Allegro MicroSystems, Inc., Worcester, Mass. USA, operate by providing a positive voltage at pin 130a, obtained from input pin 132, (from Vcc 134), when a predetermined low level magnetic field is present, and a near zero output voltage, obtained from GND pin 136a, when a predetermined high magnetic field is present. When a magnetic field of sufficient strength is present, first Hall Effect device 120a provides a low voltage output at pin 130a which in turn provides the ground circuit for second Hall Effect device 120b which then provides a low voltage output on its pin 130b, thus providing the ground circuit for relay 138. The other side of the relay coil 140 is maintained at voltage Vcc, and the relay is energized. In the absence of a sufficient magnetic field at either of the Hall-Effect devices 120a, 120b, relay 138 becomes de-energized and its output contacts switch. The output contacts of relay 138 may be used to provide visual indication 142 of the door being either properly or improperly locked through the use of red and green LEDs or an audible indication through a buzzer when relay 138 becomes de-energized.

Figure 8:
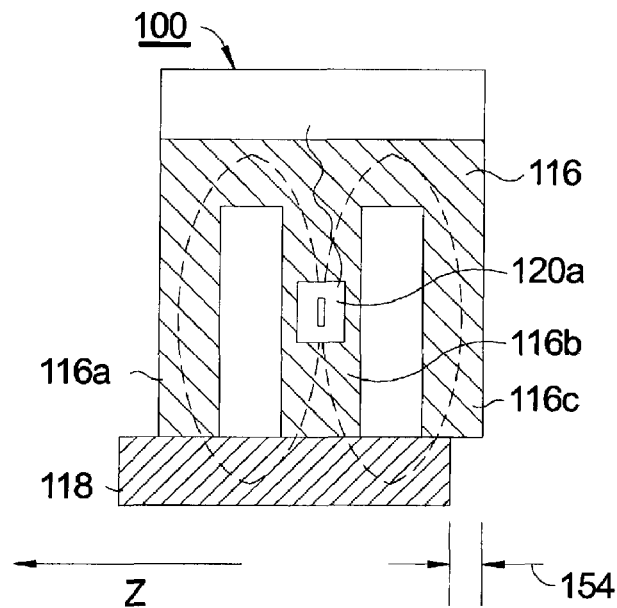
FIG. 8 is a view like that shown in FIG. 4, showing an alarm condition for lock displacement in the Z direction.
Figure 9:
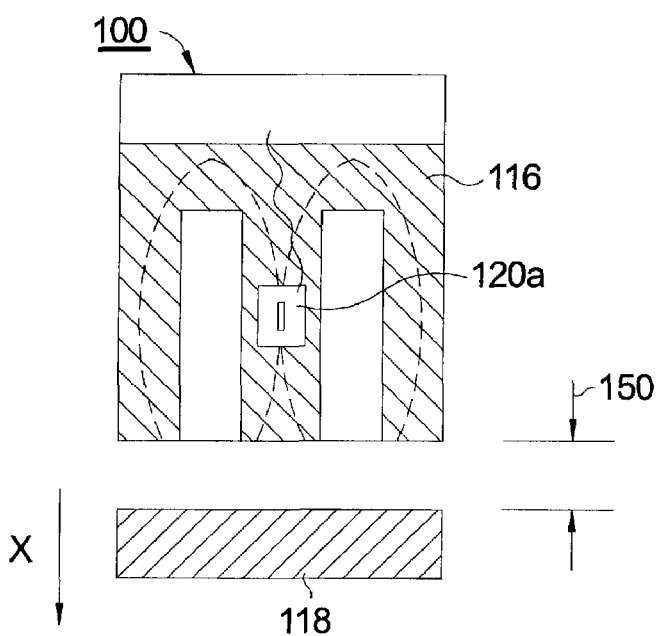

In FIG. 2, monitoring system 127 is shown in cooperation with an electro-mechanical lock having an electromagnet 116 and an armature 118. Preferably, the center of the armature and the center of the magnet are in alignment, and the armature is in close proximity to the magnet. Referring to FIGS. 6 through 9, variation in location of armature 118 with respect to magnet 116 exceeding established parameters will initiate a signal that the lock is not generating full holding potential. Such variation may occur in any of three mutually orthogonal directions X (FIGS. 6 and 9, variation limit 150), Y (FIG. 7, variation limit 152), and Z (FIG. 8, variation limit 154).

It is seen that in failure direction X, the magnetic field detected by each of Hall Effect devices 120a, 120b reaches an alarm limit for both devices. In failure direction Y, device 120a continues to experience a satisfactory magnetic field, but device 120b does not, causing an alarm condition. In failure direction Z, pole 116c is offset from armature 118 and becomes insufficiently coupled to armature 118, thus reducing the total magnetic flux through pole 116b, resulting in an alarm condition.

It can also be appreciated that a tipping of the electromagnet relative to the armature such that the face of the armature relative to the electromagnet is angularly skewed in one or more of the X, Y or Z directions can be detected by this device.

The presently-disclosed embodiments thereby provide a positive and reliable indication of displacement between the electromagnet and the armature plate in any of three directions. Additional Hall-Effect devices may be used in a system in accordance with the present invention, but generally are not warranted considering the minimal incremental improvement to the magnetic field sensing capability versus the additional magnetic field losses due to more of the core being removed.

While the invention has been described by reference to various specific embodiments, it should be understood that numerous changes may be made within the spirit and scope of the inventive concepts described. Accordingly, it is intended that the invention not be limited to the described embodiments, but will have full scope defined by the language of the following claims.

What is claimed is:

1. A system for monitoring the locked status of an electromagnetic lock, comprising a plurality of Hall Effect sensors spaced apart and disposed within a core of an electromagnetic device so as to be positioned within a magnetic field generated when said electromagnet device is energized, wherein said electromagnet core comprises three core elements formed in an E shape, wherein first and second of said plurality of Hall Effect sensors are disposed within a middle core element of said three core elements near opposite longitudinal ends of said middle core element.

2. A system in accordance with claim 1 wherein said plurality of Hall Effect sensors are electrically connected such that an alarm condition is established when any one of said sensors detects a magnetic field strength below a predetermined limit.

3. A system in accordance with claim 2 further comprising an electrical relay connected in series with said plurality of Hall Effect sensors.

4. A system in accordance with claim 1 wherein said first and second Hall Effect sensors are disposed in a zone of maximum magnetic flux density within said middle core element.

5. A system in accordance with claim 1 wherein the number of said plurality of Hall Effect sensors is two.

6. An electromagnetic lock system for securing a door to a jamb, comprising:
   a) an electromagnet for attachment to one of said door and said jamb, the electromagnet including a core, wherein said core of said electromagnet comprises three core elements formed in an E shape;
   b) a magnetically-susceptible strike plate for attachment to the other of said door and said jamb; and
   c) a plurality of Hall Effect sensors spaced apart so as to be positioned within a magnetic field generated when said electromagnet is energized, wherein first and second of said plurality of Hall Effect sensors are disposed within a middle element of said three core elements near opposite longitudinal ends of said middle element.

7. An electromagnetic lock system in accordance with claim 6 wherein the number of said plurality of Hall Effect sensors is two.

8. An electromagnetic lock system in accordance with claim 6 wherein said plurality of Hall Effect sensors are electrically connected such that an alarm condition is established when any one of said sensors detects a magnetic field strength below a predetermined limit.

9. An electromagnetic lock system in accordance with claim 6 wherein said first and second Hall Effect sensors are disposed in a zone of maximum magnetic flux density within said middle core element.

* * * * *